(12) United States Patent
Xie et al.

(10) Patent No.: US 11,561,591 B2
(45) Date of Patent: Jan. 24, 2023

(54) LED DISPLAY DRIVEN BY DUAL-NEGATIVE-VOLTAGE POWER SUPPLY

(71) Applicant: SHENZHEN ABSEN OPTOELECTRONIC CO., LTD., Guangdong (CN)

(72) Inventors: Boxue Xie, Guangdong (CN); Changjin Shi, Guangdong (CN); Yiji Chen, Guangdong (CN)

(73) Assignee: SHENZHEN ABSEN OPTOELECTRONIC CO., LTD., Shenzhen (CN)

( * ) Notice: Subject to any disclaimer, the term of this patent is extended or adjusted under 35 U.S.C. 154(b) by 274 days.

(21) Appl. No.: 16/763,852

(22) PCT Filed: May 11, 2020

(86) PCT No.: PCT/CN2020/089678
§ 371 (c)(1),
(2) Date: May 13, 2020

(87) PCT Pub. No.: WO2021/226804
PCT Pub. Date: Nov. 18, 2021

(65) Prior Publication Data
US 2021/0349510 A1    Nov. 11, 2021

(51) Int. Cl.
*G06F 1/26*        (2006.01)
*H01L 33/38*      (2010.01)
(Continued)

(52) U.S. Cl.
CPC .............. *G06F 1/26* (2013.01); *H01L 27/156* (2013.01); *H01L 33/38* (2013.01); *H01L 33/62* (2013.01)

(58) Field of Classification Search
CPC ......... G06F 1/26; H01L 27/156; H01L 33/38; H01L 33/62; H05B 45/30; H05B 45/20
See application file for complete search history.

(56) References Cited

U.S. PATENT DOCUMENTS

2003/0034966 A1    2/2003  Kim
2016/0307516 A1*  10/2016  Shiibayashi ......... G09G 3/3406

FOREIGN PATENT DOCUMENTS

CN        201359823 Y    12/2009
CN        202160308 U     3/2012
(Continued)

OTHER PUBLICATIONS

International Search Report issued in corresponding International Application No. PCT/CN2020/089678, dated Feb. 18, 2021, pp. 1-5.
(Continued)

*Primary Examiner* — Su C Kim
(74) *Attorney, Agent, or Firm* — Hauptman Ham, LLP

(57) ABSTRACT

An LED display driven by a dual-negative-voltage power supply is provided. The LED display includes a power supply interface and a display module. The power supply interface includes a first electrode, a second electrode, and a third electrode. The display module includes a substrate, the substrate is provided with a connection terminal having a first port, a second port, and a third port. The first electrode is coupled with the first port via a first wiring harness. The second electrode is coupled with the second port via a second wiring harness. The third electrode is coupled with the third port via a third wiring harness. A potential difference between the first electrode and the second electrode provides a first voltage. A potential difference between the first electrode and the third electrode provides a second (Continued)

voltage. The display module is configured to be powered with the first and second voltages.

6 Claims, 5 Drawing Sheets

(51) Int. Cl.
  *H01L 33/62* (2010.01)
  *H01L 27/15* (2006.01)

(56) References Cited

FOREIGN PATENT DOCUMENTS

| | | | |
|---|---|---|---|
| CN | 206058808 | U | 3/2017 |
| CN | 208572494 | U | 3/2019 |
| CN | 208781546 | U | 4/2019 |
| JP | 2002244619 | A | 8/2002 |
| JP | 2005136157 | A | 5/2005 |
| JP | 2005260110 | A | 9/2005 |
| JP | 2016505879 | A | 2/2016 |
| JP | 2017151142 | A | 8/2017 |
| KR | 20160080215 | A | 7/2016 |
| WO | 2003021564 | A1 | 3/2003 |

OTHER PUBLICATIONS

Japanese Office Action issued in corresponding Japanese Application No. 2020-084678, dated Jul. 6, 2021, pp. 1-4.

* cited by examiner

LED DISPLAY DRIVEN BY DUAL-NEGATIVE-VOLTAGE POWER SUPPLY

RELATED APPLICATION

The present application is a National Phase of International Application Number PCT/CN2020/089678, filed May 11, 2020.

TECHNICAL FIELD

The present disclosure relates to the field of electrical technology, and particularly to a light-emitting diode (LED) display driven by a dual-negative-voltage power supply.

BACKGROUND

At present, in the display industry, especially for light-emitting diode (LED) displays, dual voltage power supplies are usually used to supply power for display screens. Among them, the dual voltage power supply generally has a single power supply with a 3.8 V voltage output and another single power supply with a 2.8 V voltage output. Because two single power supplies are involved, the wiring layout is complex and the number of circuits is large, which leads to difficult maintenance and the probability of poor contact is greatly increased. In addition, resistance of the harnesses will cause voltage drop and energy consumption of the circuit, reduce efficiency of the power supply, and waste power resources.

SUMMARY

The present disclosure aims to provide an LED display driven by a dual-negative-voltage power supply, in which the dual-negative-voltage power supply uses a single power supply to provide dual voltages and has simple wiring. Therefore, the LED display is easy to maintain and has a low probability of poor contact. In addition, energy consumption of circuits can be reduced, power supply efficiency can be improved, and power resources can be saved.

According to the present disclosure, an LED display driven by a dual-negative-voltage power supply is provided. The LED display includes a power supply interface and a display module. The power supply interface includes a first electrode, a second electrode, and a third electrode. The display module includes a substrate, the substrate is provided with a connection terminal having a first port, a second port, and a third port. The first electrode is coupled with the first port via a first wiring harness. The second electrode is coupled with the second port via a second wiring harness. The third electrode is coupled with the third port via a third wiring harness. A potential difference between the first electrode and the second electrode provides a first voltage. A potential difference between the first electrode and the third electrode provides a second voltage. The display module is configured to be powered with the first voltage and the second voltage.

In an implementation, the first electrode is a cathode. The second electrode and the third electrode are negative electrodes. The first voltage is a first negative voltage, the second voltage is a second negative voltage. Both the first voltage and the second voltage are negative output voltages, which can reduce the power consumption on the entire circuit itself and reduce heating generation of the entire circuit, thereby prolonging a service life of the LED display.

In an implementation, the display module further includes a light emitting element, a control circuit, and a drive circuit. The drive circuit is coupled with a negative electrode of the light emitting element. The control circuit is coupled with a positive electrode of the light emitting element. The drive circuit is configured to be powered with the first negative voltage or the second negative voltage. The control circuit is configured to be powered with the second negative voltage. The light emitting element is activated when a control instruction is received by the control circuit and a drive instruction is received by the drive circuit.

In an implementation, the LED display further includes a control port. The control port is coupled with the control circuit and the drive circuit, the control port is configured to be powered with the second negative voltage. The control instruction is sent to the control circuit via the control port, the drive instruction is sent to the drive circuit via the control port.

In an implementation, the display module further includes a buffer module, the buffer module includes a first buffer chip and a second buffer chip. The control port, the first buffer chip, the second buffer chip, and the drive circuit are coupled in sequence. The first buffer chip is configured to be powered with the second negative voltage, the second buffer chip is configured to be powered with the first negative voltage.

In an implementation, the buffer module further includes a level converting circuit, the level converting circuit is coupled between the first buffer chip and the second buffer chip. The level converting circuit can balance two potential differences, thereby protecting the chips.

In an implementation, the display module further includes an acquisition circuit, the acquisition circuit is coupled between the first port and the light emitting element and is configured to acquire performance parameters of the light emitting element.

In an implementation, the light emitting element includes a red LED, a green LED, and a blue LED. The drive circuit includes a first drive circuit, a second drive circuit, and a third drive circuit. The first drive circuit is coupled with a negative electrode of the red LED, the second drive circuit is coupled with a negative electrode of the green LED, and the third drive circuit is coupled with a negative electrode of the blue LED. The first drive circuit is configured to be powered with the first negative voltage, the second drive circuit and the third drive circuit are configured to be powered with the second negative voltage.

In an implementation, the display module further includes a first stabilizing chip and a second stabilizing chip. The first stabilizing chip is coupled between the second buffer chip and the first drive circuit. The second stabilizing chip has one end coupled with the second buffer chip and the other end coupled with the second drive circuit and the third drive circuit. The first stabilizing chip is configured to be powered with the first negative voltage, the second stabilizing chip is configured to be powered with the second negative voltage.

In an implementation, the first voltage is within a first preset voltage range and the second voltage is within a second preset voltage range.

In an implementation, a floating anti-interference circuit may be provided, and the floating anti-interference circuit is coupled between the first stabilizing chip and the red LED drive circuit 61. In this way, the floating ground generated in the circuit through the anti-interference circuit is achieved.

As can be seen from the above, the LED display driven by the dual-negative-voltage power supply according to the implementations of the present disclosure utilizes one power supply to output two voltages. To provide two voltages for the display module, only three wiring harnesses (i.e., the first wiring harness, the second wiring harness, and third wiring harness) are required for electrical connection. Compared with the LED display in the related art where two single power supplies each provide one output voltage are used, the LED display provided herein only adopts one power supply, such that less space is occupied by the power supply, and the overall weight of the LED display is also reduced. In addition, the number of wiring harnesses is significantly reduced, such that the wiring is regular and convenient for maintenance. Reduction of the wiring harnesses can also reduce the energy consumption of the wiring harnesses, improve power supply efficiency, and save power resources.

BRIEF DESCRIPTION OF THE DRAWINGS

To describe technical solutions in the implementations of the present disclosure more clearly, the following briefly introduces the accompanying drawings required for describing the implementations. Apparently, the accompanying drawings in the following description merely illustrate some implementations of the present disclosure. Those of ordinary skill in the art may also obtain other obvious variations based on these accompanying drawings without creative efforts.

Figure 1:
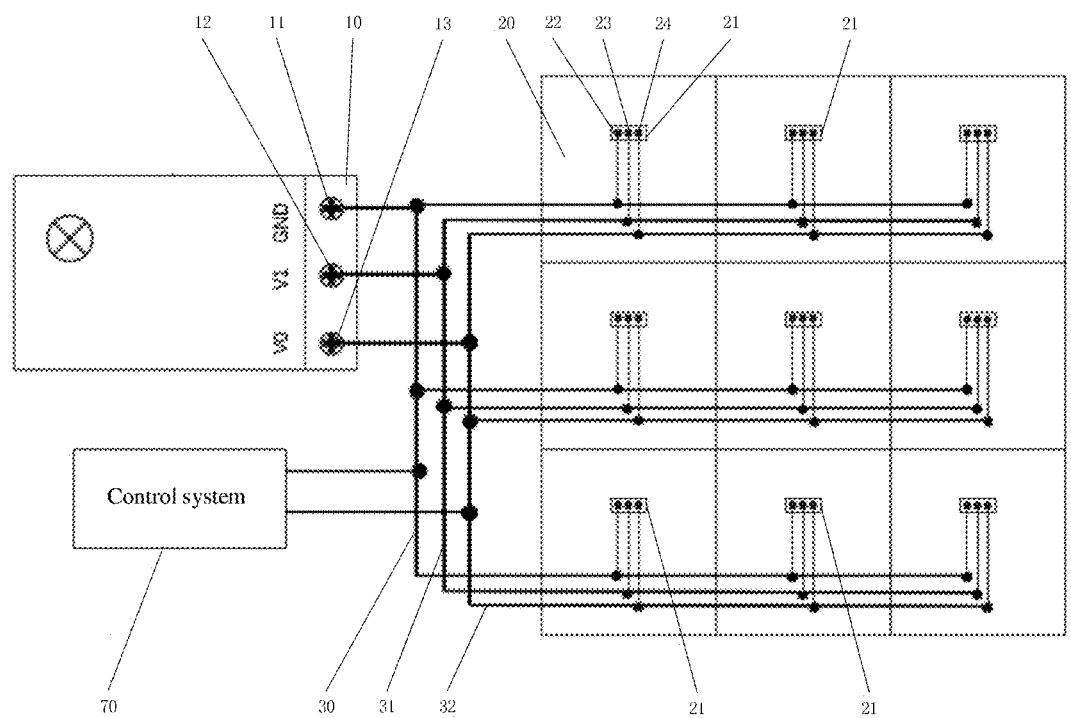
FIG. 1 is a schematic diagram illustrating wiring of an LED display according to an implementation of the present disclosure.

Reference numerals in drawings are as follows.

10—power supply interface; 11—first electrode; 12—second electrode; 13—third electrode; 20—substrate; 21—connection terminal; 22—first port; 23—second port; 24—third port; 30—first wiring harness; 31—second wiring harness; 32—third wiring harness; 40—light emitting element; 41—red LED; 42—green LED; 43—blue LED; 50—control circuit; 60—drive circuit; 61—red LED drive circuit; 62—green LED drive circuit; 63—blue LED drive circuit; 64—first stabilizing chip; 65—second stabilizing chip; 70—control system; 80—buffer module; 81—first buffer chip; 82—second buffer chip; 83—level converting circuit; 90—acquisition circuit.

DETAILED DESCRIPTION

Technical solutions in implementations of the present disclosure will be clearly and completely described in the following with reference to the accompanying drawings. Apparently, the implementations described are merely a part of rather than all implementations of the present disclosure. All other implementations obtained by those of ordinary skill in the art based on the implementations of the present disclosure without creative efforts shall be within the scope of the present disclosure.

Referring to FIG. 1, a light-emitting diode (LED) display driven by a dual-negative voltage power supply is provided according to implementations of the present disclosure. The LED display includes a power supply interface 10 and a display module. The power supply interface 10 includes a first electrode 11, a second electrode 12, and a third electrode 13. The power supply interface 10 is generally coupled with an alternating current (AC) power supply, where an AC-DC (direct current) converter is disposed in the AC power supply. The AC-DC converter is configured to convert an AC power into a low DC-voltage for use by the display module.

The display module includes a substrate 20. The substrate 20 is provided with a connection terminal 21. The connection terminal 21 has a first port 22, a second port 22, and a third port 23. The first electrode 11 ("GND" for short) is coupled with the first port 22 via a first wiring harness 30. The second electrode 12 ("V1" for short) is coupled with the second port 23 via a second wiring harness 31. The third electrode 13 ("V0" for short) is coupled with the third port 24 via a third wiring harness 32. A potential difference between the first electrode 11 and the second electrode 12 provides a first voltage. A potential difference between the first electrode 11 and the third electrode 12 provides a second voltage. The first voltage and the second voltage are used to power the display module.

As illustrated in FIG. 1, the substrate 20 is provided with nine connection terminals 21. Each of the nine connection terminals 21 has the first port 22, the second port 23, and the third port 24. For each of the nine connection terminals 21, the first port 22 thereof is coupled with the first electrode 11, the second port 23 thereof is coupled with the second electrode 12, and the third port 24 thereof is coupled with the third electrode 13.

Other elements of the LED display, such as a drive circuit, can be powered via the first port 22, the second port 23, and the third port 24. That is, the drive circuit of the LED display is coupled with the connection terminal 21. When the first voltage is required to power an element, the element is coupled to the first port 22 and the second port 23 of one of the connection terminals 21. When the second voltage is required to power the element, the element is coupled to the first port 22 and the third port 24 of one of the connection terminals 21. When needs to be powered, one element is coupled to one of the connection terminals 21.

As can be seen from the above, the LED display driven by the dual-negative-voltage power supply according to implementations of the present disclosure utilizes one power supply to provide the two voltages. To provide two voltages for the display module, only three wiring harnesses (i.e., the first wiring harness 30, the second wiring harness 31, and third wiring harness 32) are required for connection. Compared with the LED display in the related art where two single power supplies each provide one output voltage are used, the LED display provided herein only adopts one power supply, such that less space is occupied by the power supply, and the overall weight of the LED display is also reduced. In addition, the number of wiring harnesses is significantly reduced, such that the wiring is regular and convenient for maintenance. Reduction of the wiring harnesses can in turn reduce the energy consumption of the wiring harnesses, improve power supply efficiency, and save power resources.

In addition, the power supply in this implementation provides two voltages, that is, the first voltage and the second voltage, such that voltage requirements of different light emitting elements can be satisfied, thereby improving applicability. Further, it is also possible to avoid providing a large voltage to a light emitting element with small voltage requirement, thereby saving power. In this implementation, the display module further includes a light emitting element 40, and the light emitting element 40 includes LEDs. The light emitting element 40 includes at least one red LED, at least one green LED, and at least one blue LED. The red LED has a conventional voltage ranged from 2.0 V to 2.2 V, the green LED has a conventional voltage ranged from 3.0 V to 3.4 V, and the blue LED has a conventional voltage ranged from 3.0 V to 3.6 V. Thus, the first voltage can be set to range from 2.0 V to 2.2 V, the second voltage can be set to range from 3.0 V to 3.6 V. The red LED can be referred to as a red light, the green LED can be referred to as a green light, and the blue LED can be referred to as a blue light.

In an implementation, in order to further improve the applicability of the supply power, such that more light emitting elements with different conventional voltages can be powered by the power supply. The first voltage is set within a voltage range (which is referred to as a first preset voltage range), in which the voltage is greater than or equal to 2.8 V and less than or equal to 3.2 V. The second voltage is set within a voltage range (which is referred to as a second preset voltage range), in which the voltage is greater than or equal to 3.8 V and less than or equal to 4.6 V. The first voltage within the first preset voltage range and the second voltage within the second preset voltage range can be applied not only to conventional LEDs but also other types of light emitting elements, and thus have a high applicability.

In an implementation, the first electrode 11 is a cathode. The second electrode 12 and the third electrode 13 are negative electrodes. It is noted that, in this implementation, each of the negative electrodes is used as an anode. The first voltage is a first negative voltage, and the second voltage is a second negative voltage. That is, the output voltages provided by the power supply in this implementation are all negative voltages. The negative output voltages of the power supply in this implementation decreases radiation of an entire circuit of the LED display, which is beneficial to enable the LED display to meet requirements of electromagnetic compatibility (EMC). In addition, the negative output voltages can reduce the power consumption on the entire circuit itself and reduce heating generation of the entire circuit, thereby prolonging a service life of the LED display. Correspondingly, the first wiring harness 30 is an anode wire, and the second wiring harness 31 and the third wiring harness 32 are cathode wires.

Figure 2:
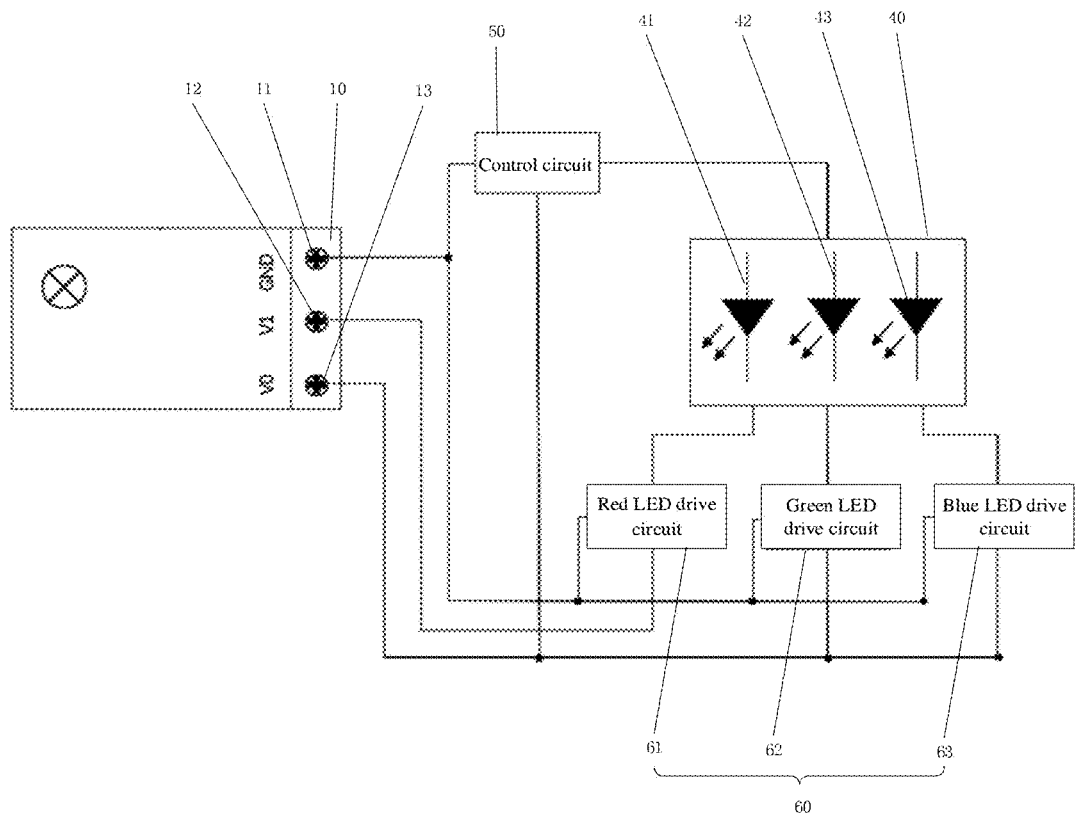
FIG. 2 is a schematic diagram illustrating a light emitting element and a drive circuit of an LED display according to an implementation of the present disclosure.

Further, those skilled in the art can appreciate that the display module needs to have the light emitting element 40 for displaying, and the light emitting element 40 needs to be driven to emit light. In an implementation, as illustrated in FIG. 2, the display module further includes the light emitting element 40, a control circuit 50, and a drive circuit 60. The drive circuit 60 is coupled with a negative electrode of the light emitting element 40, and the control circuit 50 is coupled with a positive electrode of the light emitting element 40. One of the first negative voltage or the second negative voltage is configured to power the drive circuit 60. The second negative voltage is configured to power the control circuit 50. The light emitting element 40 is activated to emit light when a control instruction is received by the control circuit 50 and a drive instruction is received by the drive circuit 60.

As can be seen from the above, both the drive circuit 60 and the control circuit 50 are powered by the negative output voltages, such that the heating generation and the power consumption of the entire circuit can be reduced and service lives of various elements can be prolonged, while ensuring that the light emitting element 40 can be driven to emit light normally. In an implementation, the control circuit 50 includes a switching transistor and a decoding circuit, where the switching transistor is turned on according to a corresponding instruction, and the decoding circuit is configured to decode a signal. The above-mentioned switching transistor may be a metal-oxide-semiconductor (MOS) field effect transistor, a transistor, an integrated MOS field effect transistor, a thyristor, or the like. Various switching transistors can be used according to actual needs.

It is noted that the connection terminals respectively coupled with the control circuit 50 and the drive circuit 60 are not illustrated in FIG. 2. However, those skilled in the art should appreciate that the control circuit 50 and the drive circuit 60 are also powered via the connection terminals.

Referring to FIG. 2, an example that the light emitting element 40 includes the red LED 41, the green LED 42, and the blue LED 43 is taken for illustration. Each of the red LED 41, the green LED 42, and the blue LED 43 needs to be driven by one drive circuit. In an implementation, the red LED 41, the green LED 42, and the blue LED 43 are driven by a first drive circuit, a second drive circuit, and a third drive circuit, respectively. In an implementation, the first drive circuit is coupled with a negative electrode of the red LED 41, the second drive circuit is coupled with a negative electrode of the green LED 42, and the third drive circuit is coupled with a negative electrode of the blue LED 43. The first drive circuit has a drive chip, and the drive chip of the first drive circuit has a positive electrode coupled with the first port 22 and a negative electrode coupled with the second port 23, such that the first negative voltage can power the first drive circuit. The second drive circuit has a drive chip, and the drive chip of the second drive circuit has a positive electrode coupled with the first port 22 and a negative electrode coupled with the third port 24, such that the second negative voltage can power the second drive circuit. The third drive circuit has a drive chip, and the drive chip of the third drive circuit has a positive electrode coupled with the first port 22 and a negative electrode coupled with the third port 24, such that the second negative voltage can power the third drive circuit. In combination with FIG. 2 in which the red LED 41, the green LED 42, and the blue LED 43 are illustrated, it can be seen that the first drive circuit serves as a red LED drive circuit 61, the second drive circuit serves as a green LED drive circuit 62, and the third drive circuit serves as a blue LED drive circuit 63. When the control circuit 50 receives the control instruction and the red LED drive circuit 61 receives the drive instruction, the red LED drive circuit 61 drives the red LED 41 to be turned on (an electrical connection is established between a negative electrode and a positive electrode of the red LED 41), and thus the red LED 41 is powered to emit light. Control processes of turning on the green LED 42 and the blue LED 43 are the same as that of the red LED 41, and will not be described in detail.

Since a working voltage of the red LED 41 is small, and working voltages of the green LED 42 and the blue LED 43 are larger than that of the red LED 41, the first negative voltage is used to power the first drive circuit, and the second negative voltage is used to power the second drive circuit and the third drive circuit. As mentioned above, the first voltage is lower than the second voltage. Thus, the above-identified first voltage and the second voltage can not only ensure a normal operation of each LED of the light emitting element 40, but also avoid providing a large voltage to a light emitting element with small voltage requirement, avoid wasting the power resources, and avoid an increase of the energy consumption due to excessive voltages, such that the power resources can be saved. In addition, powering the LED display with the negative output voltages enables heating generation of the LEDs and the drive circuit 60 to be reduced, which in turn reduce the radiation of the LED display and is beneficial to enable the LED display to meet the EMC requirements.

In an implementation, referring to FIG. 1, the LED display may further include a control port. The control port is coupled with the control system 70. The control system 70 is configured to send the control instruction via the control port. The second negative voltage is configured to power the control port, that is, two ports of the control port are coupled with the first port 22 and the third port 24 respectively, such that the second negative voltage can power the control port. In other words, the control system 70 can be powered via the control port. The second negative voltage powers the control port. On the one hand, it can ensure that the control system 70 operates normally to send the control instruction and the drive instruction. On the other hand, it can also reduce the energy consumption of the control system 70 and the heat generated by an operation of the control system 70.

Figure 6:
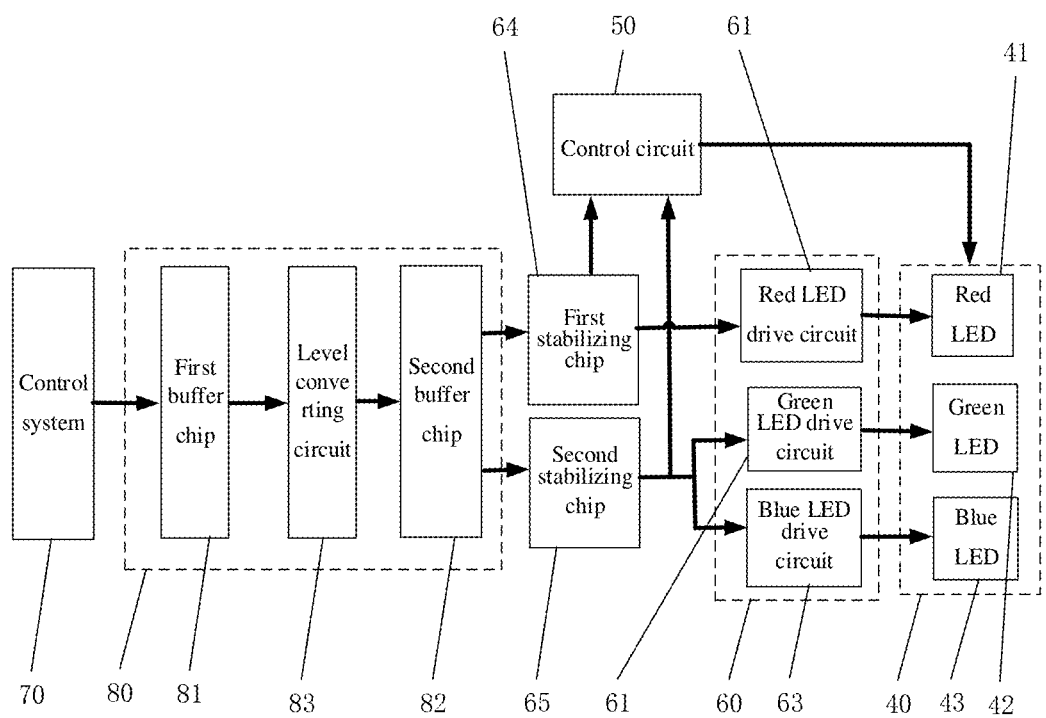
FIG. 6 is a schematic diagram illustrating a control circuit for a light emitting element of an LED display according to an implementation of the present disclosure.

Referring to FIG. 6, in a process of controlling light emission of the light-emitting element 40, the control system 70 sends the control instruction to the control circuit 50 via the control port, and sends the drive instruction to the drive circuit 60 via the control port. When the control circuit 50 receives the control instruction and the drive circuit 60 receives the drive instruction, a negative electrode and a positive electrode of the light-emitting element 40 are conductive, and thus the light-emitting element 40 is powered to emit light. The drive instruction includes parallel signals.

Figure 3:
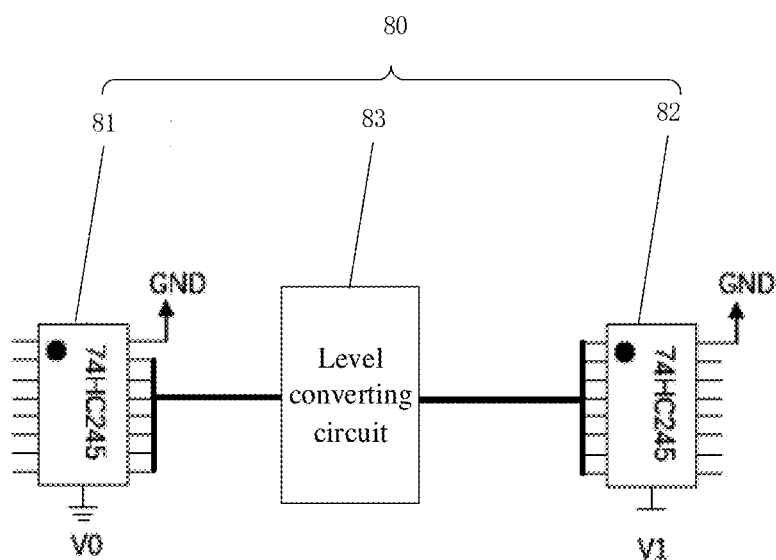
FIG. 3 is a schematic diagram illustrating a buffer module of an LED display according to an implementation of the present disclosure.

Referring to FIG. 3, the display module further includes a buffer module 80. The buffer module 80 includes a first buffer chip 81 and a second buffer chip 82. The control port, the first buffer chip 81, the second buffer chip 82, and the drive circuit 60 are coupled in sequence. It is noted that only one set of the first buffer chip 81 and the second buffer chip 82 may be provided. In practice, the first buffer chip 81 and the second buffer chip 82 are coupled with the first drive circuit, the second drive circuit, and the third drive circuit, respectively. Referring to FIG. 6, the buffer module 80 is disposed between the control system 70 and the drive circuit 60, and the drive instruction sent by the control system 70 in the form of parallel signals is transmitted to the drive circuit 60 via the buffer module 80.

Both the first buffer chip 81 and the second buffer chip 82 may be 74HC245 chips. The first buffer chip 81 can protect a master chip of the control system 70, and the second buffer chip 82 can protect the drive chips of the drive circuit 60. Thus, the LED display can operate more stably, the control system 70 and the drive circuit 60 are not easily damaged, and the service life of the LED display can be prolonged. In addition, the second negative voltage can be configured to power the first buffer chip 81. That is, the first buffer chip 81 has a positive electrode coupled with the first port 22 and a negative electrode coupled with the third port 24, such that the second negative voltage can power the first buffer chip 81. The first negative voltage can be configured to power the second buffer chip 82. That is, the second buffer chip 82 has a positive electrode coupled with the first port 22 and a negative electrode coupled with the second port 23, such that the first negative voltage can power the second buffer chip 82. Alternatively, the first buffer chip 81 can be powered by the first negative voltage and the second buffer chip 82 can be powered by the second negative voltage. No matter which negative voltage powers the first buffer chip 81, it is necessary to ensure that the first buffer chip 81 and the master chip of the control system 70 are powered by the same potential voltage, so as to reduce interference and radiation and achieve signal potential isolation effect.

In another implementation, referring to FIG. 3, the buffer module 80 further includes a level converting circuit 83. The level converting circuit 83 is coupled between the first buffer chip 81 and the second buffer chip 82. The level converting circuit 83 is configured to balance a potential difference between the first buffer chip 81 and the second buffer chip 82 to prevent chips from being damaged due to excessive current caused by the potential difference. The level converting circuit 83 can also enable the drive chips of the drive circuit 60 to use the parallel signals when a potential is lowered, such that the drive circuit 60 can operate stably. The first buffer chip 81, the level converting circuit 83, and the second buffer chip 82 are integrated into an integrated module in a hardware, thereby improving an integration of the LED display and facilitating wiring. The above-mentioned buffer module 80 is configured to prevent potential imbalance, so as to avoid damage to the chips.

Figure 4:
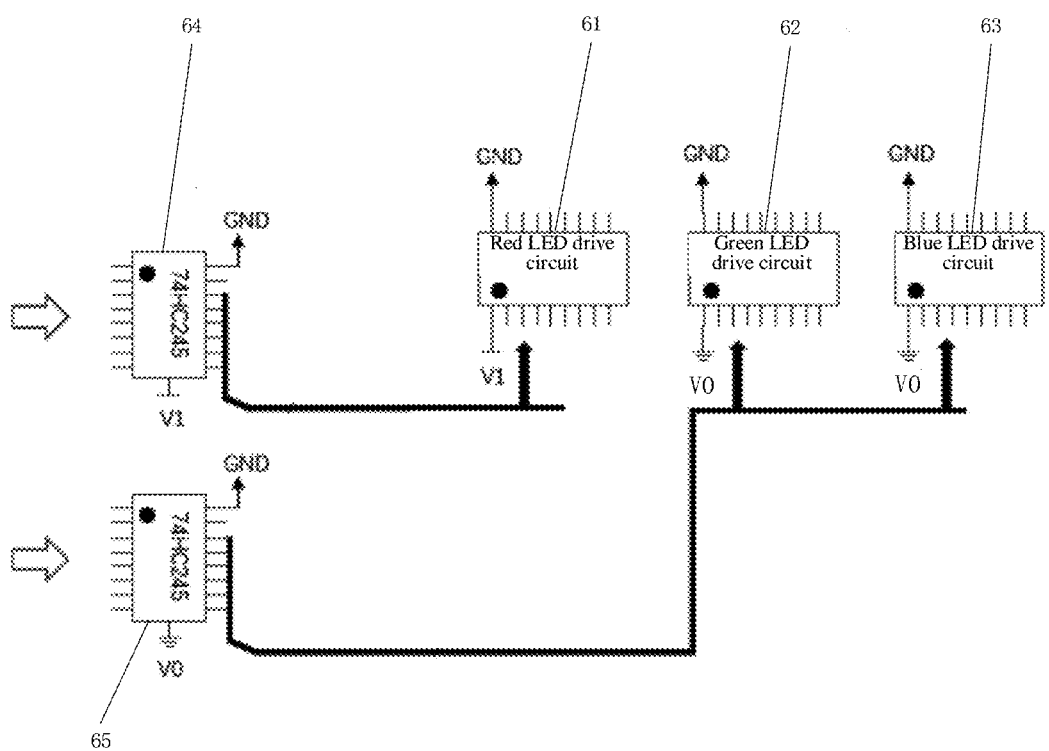
FIG. 4 is a schematic diagram illustrating a drive circuit of an LED display according to an implementation of the present disclosure.

In another implementation, referring to FIG. 4, the display module further includes a first stabilizing chip 64 and a second stabilizing chip 65. The first stabilizing chip 64 is coupled between the second buffer chip 82 and the first drive circuit. The second stabilizing chip 65 has one end coupled with the second buffer chip 82 and the other end coupled with the second drive circuit and the third drive circuit. The first negative voltage is configured to power the first stabilizing chip 64. The second negative voltage is configured to power the second stabilizing chip 65. In an implementation, the first stabilizing chip 64 has a positive electrode coupled with the first port 22 and a negative electrode coupled with the second port 23. The second stabilizing chip 65 has a positive electrode coupled with the first port 22 and a negative electrode coupled with the third port 24. Both the first stabilizing chip 64 and the second stabilizing chip 65 may be the 74HC245 chips. In an implementation, one second buffer chip 82 is provided. In another implementation, two second buffer chips 82 are provided, one of the two second buffer chips 82 is coupled with the first stabilizing chip 64 and is powered by a same negative voltage as the first stabilizing chip 64, and another one of the two second buffer chips 82 is coupled with the second stabilizing chip 65 and is powered by a same negative voltage as the second stabilizing chip 65. In this way, a potential difference between two connected chips can be reduced, so as to prevent potential imbalance and avoid damage to the chips.

In addition, referring to FIG. 4, the first stabilizing chip 64, the second stabilizing chip 65, the red LED drive circuit 61, the green LED drive circuit 62, and the blue LED drive circuit 63 are integrated into an integrated module in a hardware. In the integrated module, the first stabilizing chip 64 and the red LED drive circuit 61 are coupled via a bus, and the bus can transmit signals after level conversion, where the signals includes a signal of display data of the red LED 41, a clock signal CLK, a latch signal LAT, and an enable signal OE. One end of the second stabilizing chip 65 is coupled with one end of another bus, and the other end of the another bus is coupled with the green LED drive circuit 62 and the blue LED drive circuit 63. The another bus can transmit signals including display data of the green LED and the blue LED, the clock signal CLK, the latch signal LAT, and the enable signal OE. This improves the integration of the LED display and facilitates wiring.

When the LED display is provided with the first stabilizing chip 64 and the second stabilizing chip 65, the parallel signals from the control system 70 are sent as follows. Referring to FIG. 6, the parallel signals from the control system 70 are sent to the buffer module 80, and then outputted to the first stabilizing chip 64 and the second stabilizing chip 65 via the second buffer chip 82 of the buffer module 80. The parallel signals sent to the first stabilizing chip 64 are further sent to the red LED drive circuit 61, and the parallel signals sent to the second stabilizing chip 65 are further sent to the green LED drive circuit 62 or the blue LED drive circuit 63. In addition, the parallel signals sent by the control system 70 to the control circuit 50 are also transmitted to the buffer module 80, and then outputted to the first stabilizing chip 64 and the second stabilizing chip 65 via the second buffer chip 82 of the buffer module 80, and then transmitted to the control circuit 50 via the first stabilizing chip 64 and the second stabilizing chip 65.

The first stabilizing chip 64 and the second stabilizing chip 65 are used primarily for managing the parallel signals according to levels, so as to realize stable signal transmission in the case of floating ground and improve the anti-interference ability. In addition, the first stabilizing chip 64 can also protect the chip of the red LED drive circuit 61, and the second stabilizing chip 65 can also protect the chip of the green LED drive circuit 62 and the blue LED drive circuit 63. For example, the first stabilizing chip 64 and the red LED drive circuit 61 are powered by the first voltage, there is no need to set voltage divider resistance, which reduces the design difficulty and material cost. The temperature difference of the entire display module is more uniform, and a brightness of the LED display is improved. According to experimental test statistics, the brightness can be increased by about 15%.

In an implementation, a floating anti-interference circuit may be provided, and the floating anti-interference circuit is coupled between the first stabilizing chip 64 and the red LED drive circuit 61. In this way, the floating ground generated in the circuit can be utilized with the anti-interference circuit.

Figure 5:
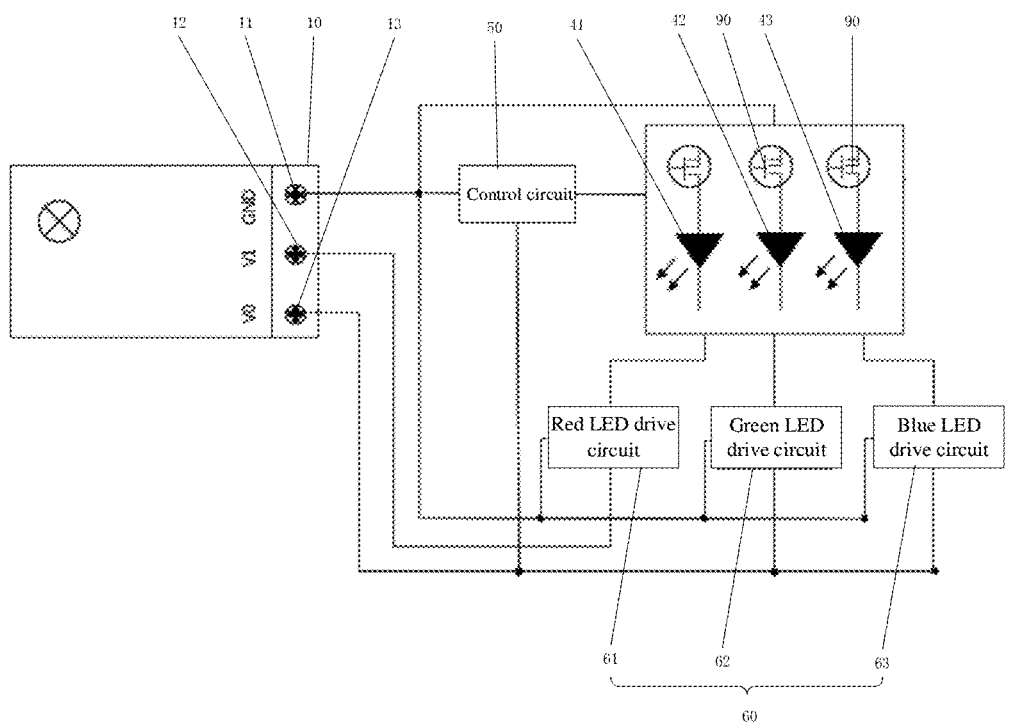
FIG. 5 is a schematic diagram illustrating an acquisition circuit of an LED display according to an implementation of the present disclosure.

In yet another embodiment, referring to FIG. 5, the display module further includes an acquisition circuit 90. The acquisition circuit 90 is coupled between the first port 20 and the light emitting element 40 and is configured to acquire performance parameters of the light emitting element 40. The performance parameters include temperature, current, voltage, and brightness of the light emitting element 40. In addition, a memory can be coupled with the acquisition circuit 90, and information of the temperature, the current, the voltage, and the brightness acquired are stored in the memory. Researchers can analyze the performance parameters in the memory to confirm whether the performance parameters of the light emitting element 40 are normal. When the performance parameters are abnormal, deviation values of the performance parameter, etc., can be further confirmed, so as to facilitate further adjustment and maintenance.

It is noted that the control port, the control circuit 50, the first buffer chip 81, the second buffer chip 82, the first stabilizing chip 64, the second stabilizing chip 65, the red LED drive circuit 61, the green LED drive circuit 62, and the blue LED drive circuit 63 can use the nine connection terminals 21 illustrated in FIG. 1, respectively. Of course, those skilled in the art need to appreciate that the number of the connection terminals 21 can be increased or decreased according to actual needs. The connection terminals 21 in the present disclosure are only exemplary, which are not limited thereto.

The implementations of the present disclosure are introduced in detail in the foregoing, and specific examples are applied herein to set forth the principle and the implementations of the present disclosure, and the foregoing illustration of the implementations is only to help in understanding the method and core ideas of the present disclosure. Meanwhile, those of ordinarily skill in the art may make variations and modifications to the present disclosure in terms of the specific implementations and application scopes according to the ideas of the present disclosure. Therefore, the specification shall not be construed as limitations to the present disclosure.

What is claimed is:

1. A light-emitting diode (LED) display driven by a dual-negative-voltage power supply, the LED display comprising:
a power supply interface and a display module,
wherein
the power supply interface comprises a first electrode, a second electrode, and a third electrode;
the display module comprises a substrate, the substrate is provided with a connection terminal having a first port, a second port, and a third port;
the first electrode is coupled with the first port via a first wiring harness, the second electrode is coupled with the second port via a second wiring harness, and the third electrode is coupled with the third port via a third wiring harness;
a potential difference between the first electrode and the second electrode provides a first voltage, a potential difference between the first electrode and the third electrode provides a second voltage, and the display module is configured to be powered with the first voltage and the second voltage;
the first electrode is a cathode, the second electrode and the third electrode are negative electrodes;
the first voltage is a first negative voltage, the second voltage is a second negative voltage;
the display module further comprises a light emitting element, a control circuit, and a drive circuit;
the drive circuit is coupled with a negative electrode of the light emitting element, the control circuit is coupled with a positive electrode of the light emitting element;
the drive circuit is configured to be powered with the first negative voltage or the second negative voltage, the control circuit is configured to be powered with the second negative voltage; the light emitting element is activated when a control instruction is received by the control circuit and a drive instruction is received by the drive circuit;
the LED display further comprises a control port, wherein the control port is coupled with the control circuit and the drive circuit, the control port is configured to be powered with the second negative voltage; and
the control instruction is sent to the control circuit via the control port, the drive instruction is sent to the drive circuit via the control port; and
the display module further comprises a buffer module, the buffer module comprises a first buffer chip and a second buffer chip, wherein the control port, the first buffer chip, the second buffer chip, and the drive circuit are coupled in sequence; and the first buffer chip is configured to be powered with the second negative voltage, the second buffer chip is configured to be powered with the first negative voltage.

2. The LED display of claim 1, wherein the buffer module further comprises a level converting circuit, the level converting circuit is coupled between the first buffer chip and the second buffer chip.

3. The LED display of claim 1, wherein the display module further comprises an acquisition circuit, the acquisition circuit is coupled between the first port and the light emitting element and is configured to acquire performance parameters of the light emitting element.

4. The LED display of claim 1, wherein the light emitting element comprises a red LED, a green LED, and a blue LED;

the drive circuit comprises a first drive circuit, a second drive circuit, and a third drive circuit, wherein the first drive circuit is coupled with a negative electrode of the red LED, the second drive circuit is coupled with a negative electrode of the green LED, and the third drive circuit is coupled with a negative electrode of the blue LED; and the first drive circuit is configured to be powered with the first negative voltage, the second drive circuit and the third drive circuit are configured to be powered with the second negative voltage.

5. The LED display of claim 4, wherein the display module further comprises a first stabilizing chip and a second stabilizing chip;

the first stabilizing chip is coupled between the second buffer chip and the first drive circuit;

the second stabilizing chip has one end coupled with the second buffer chip and the other end coupled with the second drive circuit and the third drive circuit; and the first stabilizing chip is configured to be powered with the first negative voltage, the second stabilizing chip is configured to be powered with the second negative voltage.

6. The LED display of claim 1, wherein the first voltage is within a first preset voltage range and the second voltage is within a second preset voltage range.

* * * * *